United States Patent [19]

Yee

[11] 4,028,647
[45] June 7, 1977

[54] MONOLITHIC CRYSTAL FILTERS

[75] Inventor: Henry Kai-Hen Yee, Montreal, Canada

[73] Assignee: Northern Telecom Limited, Montreal, Canada

[22] Filed: Apr. 29, 1976

[21] Appl. No.: 681,438

[52] U.S. Cl. ............................... 333/72; 310/8.2
[51] Int. Cl.² .................. H03H 9/26; H03H 13/00; H03H 7/08
[58] Field of Search ............... 333/72, 71; 330/174; 331/116 R; 310/8, 8.2, 8.3, 9.7, 9.8

[56] References Cited

UNITED STATES PATENTS

| 2,248,776 | 7/1941 | Och | 333/72 |
| 3,564,463 | 2/1971 | Beaver et al. | 333/72 |

OTHER PUBLICATIONS

Yee—"Finite–Pole Frequencies in Monolithic Crystal Filters", in Proceedings of the IEEE, Jan. 1971; pp. 88–89.

Primary Examiner—Alfred E. Smith
Assistant Examiner—Marvin Nussbaum
Attorney, Agent, or Firm—Achmed N. Sadik

[57] ABSTRACT

An improved monolithic piezoelectric filter unit having two bilateral electrodes on one surface and a common electrode on the opposite surface, the common electrode connected to the common terminal of the filter unit via a capacitor.

9 Claims, 9 Drawing Figures

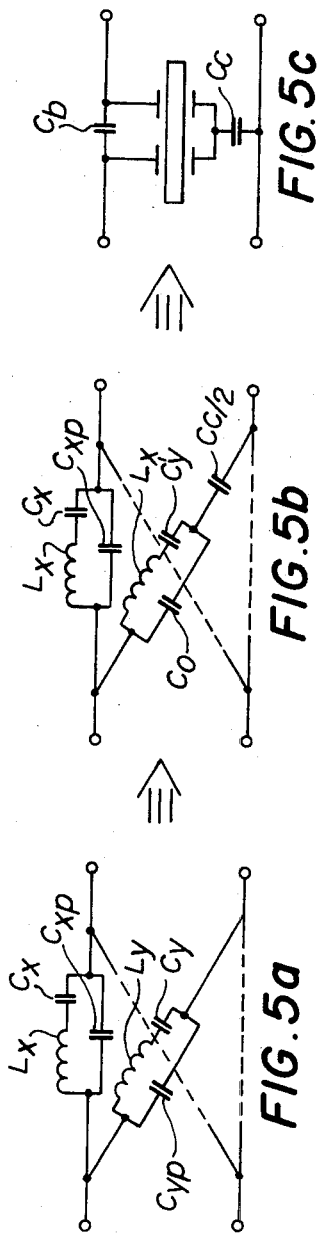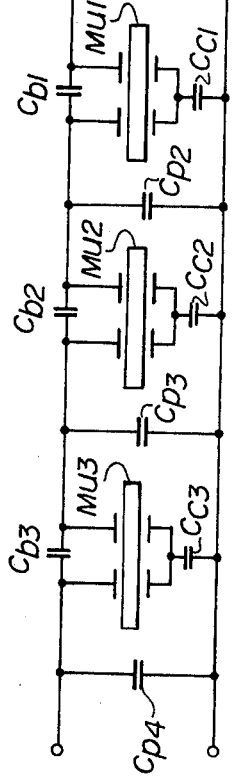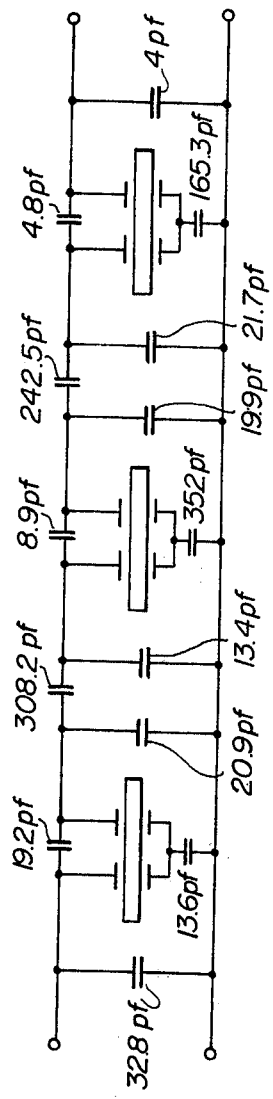
FIG.5c
FIG.5b
FIG.5a
FIG.6
FIG.7

MONOLITHIC CRYSTAL FILTERS

FIELD OF THE INVENTION

The present invention relates to crystal filters in general and to those utilizing monolithic crystals in particular.

BACKGROUND AND PRIOR ART OF THE INVENTION

The monolithic crystal filter was invented by William D. Beaver and Roger A. Sykes and patented in Canadian Pat. No. 863,480 granted Feb. 9, 1971 to Western Electric Company, Incorporated, U.S.A. This patent is generally useful in understanding the theory and operation of such devices. More recently, practical polylithic filter devices, that is filters utilizing a plurality of monolithic crystals, have been patented. U.S. Pat. No. 3,676,806 issued July 11, 1972 to Henry T. Orchard and Desmond F. Sheahan, for example, discloses such practical device.

In essence, the basic 2-pole monolithic crystal is a specifically dimensioned monolithic slab of piezoelectric material having electrodes for two resonators deposited on its surfaces. It performs a filtering function because of the intra-crystal coupling between the resonators. The coupling between resonators is to a large extent determined by the interelectrode spacing, often a critical factor difficult to control It is the difficulty of controlling the critical coupling in a monolithic crystal, for example, that does not permit practical predistorted filter designs. In a paper by R.J. Byrne entitled: "Monolithic Crystal Filters", Proceedings of the 24th ASFC (Annual Symp. on Frequency Control), pp 84–92, April 1970, the most critical parameter in the manufacture of these filters is found to be the coupling between resonators.

SUMMARY OF THE INVENTION

The present invention introduces a 2-pole monolithic bandpass filter configuration that: (1) allows for coupling adjustment external to the crystal, so that the coupling tolerance in the crystal itself can be related with an attendant cost reduction; (2) permits predistorted filter designs with improved passband performance; (3) the stray capacitance between adjacent crystal electrodes is accounted for in the design and this is exploited to provide finite poles, one in each of the stopbands of the filter, (Vide: "Finite-Pole Frequencies in Monolithic Crystal Filters" by H.K.H. Yee, Proceedings of the IEEE, Vol. 59, No. 1, January 1971).

According to the present invention, the novel monolithic bandpass filter unit comprises: a monolithic piezoelectric crystal substrate having two adjacent electrodes on one surface thereof constituting two bilateral terminals of said filter unit, and a common electrode on the other surface opposite said two electrodes, whereby the resulting structure acts as a pair of coupled resonators; predetermined coupling capacitance between said two adjacent electrodes; and a capacitor interconnecting said one common electrode and a common terminal of said filter unit and adapted, in cooperation with said coupling capacitance, to introduce a pair of finite poles one in each of the upper and lower stopbands of said filter unit.

In the aforementioned device, the coupling between the two coupled resonators is controlled by both the coupling in the crystal (K) as well as by the capacitor ($C_c$) interconnecting the common electrode and the common terminal of the device. Since the capacitor $C_c$ can be made variable, the coupling tolerance for the 2-pole crystal may be relaxed.

As will become clear later on, the capacitor $C_c$ makes possible exact designs of filter configuration utilizing a plurality of said monolithic filter units in tandem connection. Such composite filter has hitherto not been realized. It has the advantage of a lower order for a performance comparable with other, higher order, monolithic filters.

BRIEF DESCRIPTION OF THE DRAWINGS

A preferred embodiment of the present invention will now be described in conjunction with the drawings in which:

FIGS. 5a, 5b 5c show the conversion of a conventional lattice subsection into a subsection equivalent to the filter unit of FIG. 1;

FIG. 6 shows the final complex polylithic filter utilizing the filter unit of FIG. 1; and FIG. 7 shows a variation of the filter of FIG. 6 with monolithic units having identical inductances.

DESCRIPTION OF THE PREFERRED EMBODIMENT

Figure 1:
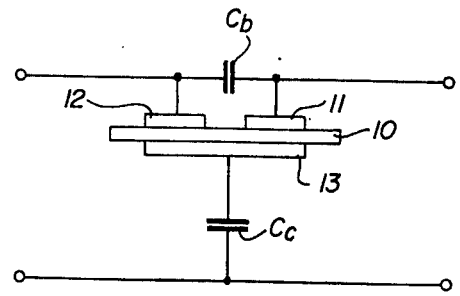
FIG. 1 is a monolithic filter unit according to the present invention.

FIG. 1 of the drawings depicts a monolithic bandpass filter unit according to the present invention. It comprises a conventional 2-pole monolithic crystal 10 having two conductive electrode pads 11 and 12 deposited on one surface thereof and a third conductive electrode 13 coextensive with the electrodes 11 and 12, on the other surface of the crystal 10. Of course, the electrode 13 may be made of two separate but electrically interconnected electrodes. The electrodes 11 and 12 are two bilateral terminals of the unit, and are bridged by a bridging capacitance $C_b$. The electrode 13 is connected to the common terminal of the unit via a coupling capacitor $C_c$. How the values of the capacitors $C_b$ and $C_c$ are determined will be demonstrated in the following explanation of a design procedure utilizing the novel filter unit with reference to FIGS. 2 to 6 of the drawings.

The chosen design procedure begins along conventional lines and is characterized by the following steps:

1. From the filter specification, the order of the final filter and the number of finite poles are estimated, and the filter polynomials are computed taking in account the effects of component losses.

Figure 2:
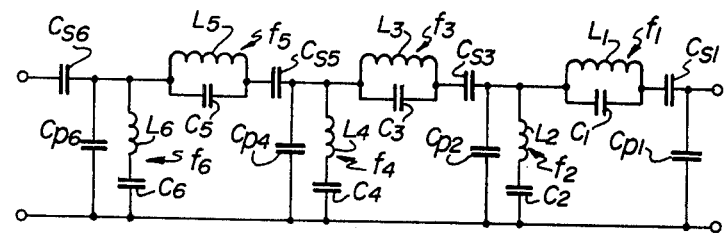
FIG. 2 is a conventional parametric LC filter structure as the first step in designing a complex polylithic filter utilizing the filter unit of FIG. 1.
Figure 3:
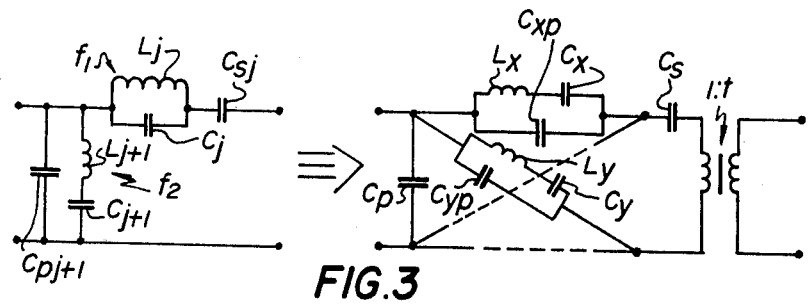
FIG. 3 shows the transformation of subsections of the filter of FIG. 2 into the corresponding lattice section.

2. Based on the computed polynomials, the filter is structured in a LC ladder configuration. FIG. 2 shows such a structure in the parametric form, (see, for example, "Filter Design Using Transformed Variables" by H.J. Orchard and G.C. Temes in IEEE Transactions on Circuit Theory, pp 385–407, December 1968). The designations $f_0$ to $f_6$ in FIG. 2 are the frequencies of the respective parallel or series tuned circuit. The parallel tuned circuits in the series arms procedure the finite poles in the upper stopband, while the series resonant circuits produce the finite poles in the lower produce 3. Now each inverted L section of the structure in FIG. 2 is transformed into its equivalent lattice section. This shown in FIG. 3. The relationship between the various components of both sections is as follows:

$$t = \left[\frac{C_{j+1}}{C_j}\rho(\rho+1)+1\right]^{1/2}$$

where $t$ is the transformer ratio of the transformer that would be necessary to maintain the same impedance level, and $\rho$ is:

$$\rho = \left[\left(\frac{f_1}{f_2}\right)^2 - 1\right]^{-1}$$

$$C_p = C_{pj+1} - \rho C_{j+1}$$

$$C_s = t^2 \frac{C_j C_{sj}}{C_j - \rho C_{sj}}$$

$$L_x = \left(1 - \frac{1}{t}\right)L_{j+1}; \quad C_x = \frac{1}{(2\pi f_2)^2 L_x}; \quad C_{xp} = \rho C_x; \text{ and}$$

$$L_y = \left(1 + \frac{1}{t}\right)L_{j+1}; \quad C_y = \frac{1}{(2\pi f_2)^2 L_y}; \quad C_{yp} = \rho C_y.$$

Figure 4:
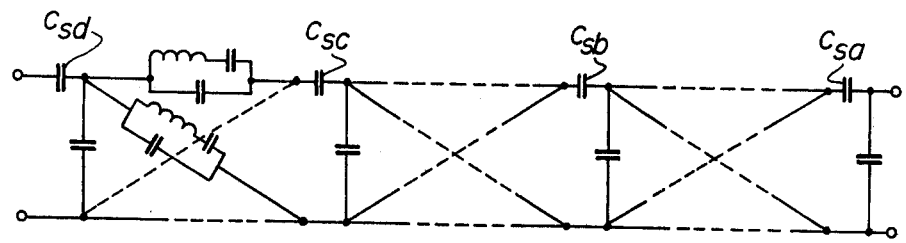
FIG. 4 shows the lattice equivalent of the filter in FIG. 2.

(4) The resultant equivalent lattice structure is shown in FIG. 4, (note the transformer has been eliminated by scaling the components of each section by the factor $t$). The inverted L sections in FIG. 2 are used to scale the crystal inductances as they appear in the equivalent lattice to realistic and acceptable values. This is done by multiplying all inductive components of the circuit by a factor larger than one and dividing all capacitive values by the same factor. Such scaling does not affect the properties of the total circuit in either its ladder or lattice configuration. In addition, the series capacitors, $C_{sa}$, $C_{sb}$, $C_{sc}$, $C_{sd}$ in FIG. 4 are subsequently eliminated by absorbing them into the lattices. This is a well-known technique. The resultant structure is identical to that of FIG. 4 without these series capacitors.

5. FIG. 5 shows the transformation from the standard lattice section (a) to the lattice section (b) equivalent to the novel filter unit (c).

In the standard lattice section shown in FIG. 5 (a), the following constraints must be met $C_{xp} > C_{yp}$,
$L_x > L_y$, and
$C_x > C_y$ In order to realize such a section by means of a monolithic unit, however, $L_x$ must be made equal to $L_y$ and $C_{yp}$ must equal the static capacity $C_o$ of the monolithic unit. In order to meet these latter requirements, the transformed section shown in FIG. 5($b$) contains the capacitance $C_c/2$ in each of its diagonal arms. These two capacitances become $C_c$ in the final monolithic version as shown in FIG. 5($c$). In addition to these changes, the capacitance $C_y$ in the diagonal arms becomes $C_y'$, having a different value.

Now the capacitance $C_o$ is the actual static capacitance of the monolithic crystal and is a measurable quantity. It also is given by the formula $$C_o = \epsilon A/d$$

where $\epsilon$ = dielectric constant of the crystal material; $A$ = the area of either of the electrodes 11 or 12, and $d$ = the crystal thickness. The inductance $L_x$ of the crystal is determined from the frequency $f$ by $$L_x = 1.9/f^2 A$$

where $A$ again is the area of either of the electrodes 11 or 12.

$C_b$, the bridging capacitance, including the stray capacitance between the electrodes 11 and 12, is $$C_b = \frac{C_{xp} - C_o}{2}$$

And finally, $C_c$ itself equals $$C_c = \frac{2C_o}{\sqrt{\frac{L_y}{L_x}} - 1}$$

Thus, the monolithic unit of FIG. 5($c$) is fully determined and, hence, the final filter shown in FIG. 6.

NUMERICAL EXAMPLE

A numerical example for a filter suitable for a channel bank according to the following requirements will now be given:

Passband ripple = 0.1 db peak-to-peak
Passband: 8,240,400 Hz to 8,243,700 Hz
Bandwidth: 3,300 Hz
Attenuation in lower stopband below 8,239,750 Hz > 45 db
Attenuation in upper stopband above 8,244,250 Hz 45 db and
Impedance level range 500 to 500 ohms.

From the above requirements, the order of the filter is estimated to be 14, with 3 finite poles in either of the lower and upper stopbands. By using the known technique of transformed variables, the precise location of the stopband frequencies are determined to be:

| | |
|---|---|
| $f_{\infty 1} = 8,235,917$ Hz; | $f_{\infty 4} = 8,244,205$ Hz; |
| $f_{\infty 2} = 8,239,137$ Hz; | $f_{\infty 5} = 8,244,651$ Hz; |
| $f_{\infty 3} = 8,239,748$ Hz; | $f_{\infty 6} = 8,246,566$ Hz. |

Using predistorted design techniques and assuming relatively low crystal quality-factors (Q) of 150,000, the following values for the LC filter of FIG. 2 are obtained:

$C_{p1}$; 2; 4; 6 = 40.142776; 356.9302; 185.3256; 94.9850 all in pF
$C_{s1}$; 3; 5; 6 = 196.5927; 34.925919; 51.326459; 308.57228 all in pF
$L_1$; 3; 5 = 0.008540067; 0.00610500; 0.00273538 all in mH
$C_1$; 3; 5 = 43614.679; 61039.348; 13624.628 all in pF
$L_2$; 4; 6 = 0.7098813; 2.734558; 9.5987748 all in mH
$C_2$; 4; 6 = 0.52605434; 0.13645506; 0.038868394 all in pF The impedance of the right-hand port is 500 ohm and that of the left-hand port is 881.3428 ohm.

Carrying the intermediate calculations out, one arrives at the following values for the final filter of FIG. 6, which are:

$C_{p1}$; 2; 3; 4 =4.8; 34.5; 27.1; 26.1 all in pF
$C_{b1}$; 2; 3 =4.3; 5.4; 17.6 all in pF
$C_{c1}$; 2: 3 =97.8; 24.1; 9.5 all in pF The impedance of the right-hand port is 998 ohm, and that of the left-hand port is 1539 ohm.

The monolithic crystal parameter of the three monolithic units MU1, MU2 and MU3 are:

| MU1 | MU2 | MU3 |
|---|---|---|
| L = 22.3 mH | L = 37.1 mH | L = 20 mH |
| $C_o$ = 3.8 pF | $C_o$ = 2.3 pF | $C_o$ = 4.2 pF |
| k = 0.058194968% | k = 0.1100972% | k = 0.1317138% |
| $f_o$ = 8240048 Hz | $f_o$ = 8239914 Hz | $f_o$ = 8236959 Hz |

Those skilled in the art will be able to devise variations of the herein-disclosed devices to suit their particular requirements. For example, it is possible to make the three monolithic units MU1, MU2 and MU3 identical in their inductance values L by converting the two parallel capacitors $C_{p2}$ and $C_{p3}$ in FIG. 6 to their equivalent $\pi$ networks. Such converted final filter is shown in FIG. 7 with the transformed values adjacent the filter components. Each monolithic unit, then, has the same inductance L = 20 mH, and also the same static capacity $C_o$ = 4.2 pF. The remaining parameters are:

| MU1 | MU2 | MU3 |
|---|---|---|
| k = 0.053015612% | k = 0.06361794% | k = 0.10872454% |
| f = 8240360 Hz | f = 8239403 Hz | f = 8238085 Hz |

What is claimed is:

1. A monolithic bandpass filter unit having an upper and a lower stopband comprising a monolithio piezoelectric substrate substrate having two adjacent electrodes on one surface thereof constituting two bilateral terminals of said filter unit, and a common electrode on the other surface opposite said two electrodes, whereby the resulting structure acts as a pair of coupled resonators; predetermined coupling capacitance between said two adjacent electrodes; and a capacitor interconnecting said common electrode and a common terminal of said filter unit and adapted, in cooperation with said coupling capacitance, to introduce a pair of finite poles one in each of the stopbands of said filter unit.

2. The filter unit of claim 1, said common electrode constituted of two electrically interconnected conductive pads each of which is coextensive with the opposite bilateral electrode.

3. The filter unit of claim 1, said common electrode being a single conductive pad coextensive with said two adjacent electrodes on the opposite surface.

4. The filter unit of claim 1, having predetermined capacitance between each of said bilateral terminals and said common terminal.

5. The filter unit of claim 2, having predetermined capacitance between each of said bilateral terminals and said common terminal.

6. The filter unit of claim 3, having predetermined capacitance between each of said bilateral terminals and said common terminal.

7. A polylithic filter apparatus having an input and an output comprising a plurality of the filter units of claim 1, connected in tandem and having a predetermined capacitance connected in parallel at each tandem-connection junction, and having predetermined parallel capacitance in parallel with said input and said output.

8. A polylithic filtering apparatus having an input and an output comprising a plurality of the filter units of claim 2, connected in tandem and having a predetermined capacitance connected in parallel at each tandem-connection junction, and having predetermined parallel capacitance in parallel with said input and said output.

9. A polylithic filtering apparatus having an input and an output comprising a plurality of the filter units of claim 3, connected in tandem and having a predetermined capacitance connected in parallel at each tandem-connection junction, and having predetermined parallel capacitance in parallel with said input and said output.

* * * * *

Notice of Adverse Decision in Interference

In Interference No. 100,050, involving Patent No. 4,028,647, H. K.-H. Yee, MONOLITHIC CRYSTAL FILTERS, final judgment adverse to the patent was rendered June 18, 1982, as to claims 1, 2, 4, 5, 7 and 8.
[*Official Gazette November 9, 1982.*]